United States Patent [19]

Manes

[11] Patent Number: 4,967,159
[45] Date of Patent: Oct. 30, 1990

[54] SELF-BALANCING REFLECTOMETER

[75] Inventor: Michael R. Manes, Littleton, Colo.

[73] Assignee: Abbott Laboratories, Abbott Park, Ill.

[21] Appl. No.: 315,371

[22] Filed: Feb. 23, 1989

[51] Int. Cl.⁵ .......................... H04B 1/04; H03H 7/40
[52] U.S. Cl. .................................... 324/650; 324/642; 455/115; 455/125
[58] Field of Search ............... 455/115, 120, 121, 124, 455/125, 126; 334/58, 78, 84; 324/650, 642

[56] References Cited

U.S. PATENT DOCUMENTS

| | | |
|---|---|---|
| 2,912,569 | 11/1959 | Shepherd . |
| 3,117,279 | 1/1964 | Ludvigson et al. . |
| 3,601,717 | 8/1971 | Kuecken . |
| 3,643,163 | 2/1972 | Bruck ................................. 455/125 |
| 3,678,381 | 7/1972 | Beaudry . |
| 3,717,811 | 2/1973 | Wheeler . |
| 3,786,355 | 1/1974 | Midkiff ............................... 455/115 |
| 3,800,218 | 3/1974 | Shekel . |
| 3,870,957 | 3/1975 | Straw ................................. 455/115 |
| 3,919,644 | 11/1975 | Smolka . |
| 4,072,897 | 2/1978 | Takayama . |
| 4,096,441 | 6/1978 | Schwartz . |
| 4,335,469 | 6/1982 | Tharp ................................. 455/125 |
| 4,392,245 | 7/1983 | Mitama . |
| 4,409,544 | 10/1983 | Redlich . |
| 4,447,783 | 5/1984 | Quick ................................. 455/117 |
| 4,493,112 | 1/1985 | Bruene ............................... 455/115 |
| 4,495,807 | 1/1985 | Field et al. . |
| 4,647,871 | 3/1987 | Turner ................................ 455/117 |

OTHER PUBLICATIONS

*A Low-Power RF Wattmeter*, The Radio Amateur's Handbook, p. 539, American Radio Relay League (1977).
*A Wide-Band Efficient Inductive Transdermal Power and Data Link With Coupling Insensitive Gain*, IEEE Transactions on Biomedical Engineering, vol. BME-34, No. 4, Apr. 1987.
*Controlled External Powering of Miniaturized Chronically Implanted Biotelemetry Devices*, IEEE Transactions on Biomedical Engineering, vol. BME-32, No. 2, Mar. 1976.

*Primary Examiner*—Reinhard J. Eisenzopf
*Assistant Examiner*—Jose M. Solis
*Attorney, Agent, or Firm*—Richard D. Schmidt; John W. Cornell

[57] ABSTRACT

A preferred embodiment of a self-balancing reflectometer is disclosed in conjunction with a system including an RF source, an RF load, and an RF transmission channel that carries RF signals transmitted by the source to the load. The self-balancing reflectometer includes a load current sampler that generates a first sample signal related to load current by a first fixed value of gain and a load voltage sampler that generates a second sample signal related to load voltage by a voltage-responsive second variable value of gain. The first sample signal is subtracted from the second sample signal and the resulting difference signal is applied to the RF port of a double balanced mixer. The RF voltage signal appearing at the load is applied to the LO port of the mixer, which generates an IF signal that varies with both rapid load impedance modulation corresponding to load data and long term basal variations in load impedance unrelated to load data. A high gain amplifier generates output data signals corresponding to the load data and an integrator generates a gain adjustment voltage which varies with the long term variations. The gain adjustment voltage is applied to the load voltage sampler to vary the second variable value of gain in a manner to drive the difference signal to zero, thus automatically balancing the reflectometer. At the balance point, the value of the gain adjustment voltage is related to the value of load impedance by a known formula. The reflectometer is selectably responsive to either the rear or imaginary component of load impedance.

46 Claims, 2 Drawing Sheets

SELF-BALANCING REFLECTOMETER

BACKGROUND OF THE INVENTION

1. Field of the Invention

The invention relates generally to reflectometer apparatus which detects RF signals reflected by an electrical load to which RF signals are transmitted. More specifically, the invention concerns an RF reflectometer which includes self-balancing means operative to automatically achieve and maintain a balanced or null output condition in response to variations in the reflected signals due to long term basal variations in the impedance of the load while simultaneously providing a detectable output in response to rapid variations in said signals, for example due to intentional modulation of the load impedance.

2. Description of the Prior Art

It is generally known in the field of RF signal transmission that when the output impedance of an RF source matches the input impedance of a load, the efficiency of power transfer between the source and load is maximized. Theoretically, when the source and load impedances are exactly matched, the load absorbs 100% of the signal transmitted by the source. However, when the load impedance varies from the source impedance, the load does not absorb the entire signal and "reflects" a portion of the signal back to the source.

By definition, impedance has a real component and an imaginary component. The RF impedance of the load can vary over time for any number of reasons. Such variations may occur in either the real or imaginary component of the impedance, or both.

Generally, a mismatch between the real components of the source and load impedance results in the load reflecting a portion of the transmitted signal in phase with the transmitted signal. This is the real component of the reflected signal. A mismatch between the imaginary components of the source and load impedances results in the load reflecting a portion of the transmitted signal back to the source with a phase variation from the transmitted signal. This is the imaginary component of the reflected signal. By definition, the real and imaginary components of the reflected signal are 90 degrees out of phase or in "phase quadrature."

The value of forward RF power from an RF source to a load gives an indication of the strength of the signal being transmitted to the load, and is useful in adjusting the output power level of the source to a desired level. However, forward power provides no information concerning the sign or magnitude of variations of the load impedance from the source impedance. The value of the reflected RF signal on the other hand contains information concerning both the sign and magnitude of mismatch between the source and load impedance.

Circuits and instruments which are responsive to forward RF power have been developed for use in RF communications systems to monitor and adjust the power output of RF transmitters in response to variations in load impedance, but without providing any information about or any detectable output indicative of the variations. See, for example, the devices described in Mitama U.S. Pat. No. 4,392,245 and Wheeler U.S. Pat. No. 3,717,811.

Circuits and instruments that detect the RF signal reflected by a load have also been developed for a variety of RF communications applications. Such devices have been employed to assist in matching source and load impedances to optimize long range transmission of RF signals between RF transmitters and receivers. See, for example, the automatic antenna coupler disclosed by Smolka U.S. Pat. No. 3,919,644; the automatic impedance matching system disclosed in Kuecken U.S. Pat. No. 3,601,717; and the automatic antenna tuning device disclosed in Ludvigson et al. U.S. Pat. No. 3,117,279. Such devices have also been employed to measure and monitor certain parameters of RF communications systems such as standing wave ratio (SWR), reflection coefficient, forward power level, and antenna impedance. See, for example, the coupling apparatus disclosed in Wheeler U.S. Pat. No. 3,717,811 (FIG. 2); the RF impedance bridge disclosed in Shekel U.S. Pat. No. 3,800,218; the transmitter test instrument disclosed in Schwartz U.S. Pat. No. 4,096,441; the forward power and antenna impedance measuring apparatus disclosed in Redlich U.S. Pat. No. 4,409,544; and the in-line wattmeter disclosed in Beaudry U.S. Pat. No. 3,678,381.

The known circuits and instruments are typically designed to operate with a characteristic fixed impedance $Z_o$. In RF communications applications, this characteristic impedance is commonly 50 or 75 ohms with no reactive component, although in some instances the characteristic impedance may be selected to match the optimum load impedance for the RF source. Thus, it is generally necessary to manually calibrate known circuits and instruments using a load having the fixed characteristic impedance value before using them. In the case of RF power and impedance bridges, for example, this typically involves manually adjusting the value of at least one component of the bridge to produce a null or zero output when a load known to have the desired characteristic value of impedance is present. This is referred to as nulling or balancing the bridge. Once calibrated, such circuits are operative to detect absolute variations in load impedance from the characteristic impedance, but do not discriminate between or provide any indication concerning different types or causes of impedance variations.

In addition, the known circuits and instruments, particularly those employing directional couplers, generally respond undesirably to variations in the frequency of the forward RF signal. As a result, the frequency of the forward signal must generally be maintained within a narrow bandwidth if such circuits and instruments are to provide accurate power measurements. This limitation has the undesirable effect of restricting the use of directional couplers to relatively narrow bandwith signals. Variations in the magnitude of the forward RF signal also affect measurements of the reflected RF signal by such circuits and instruments and may be misinterpreted by such circuits and instruments as variations in load impedance. This effect is particularly undesirable in certain applications, such as those described below, wherein data is transmitted by the load by intentionally modulating its own impedance.

In certain biomedical applications, for example, an external source communicates RF power and/or data signals to an implanted prosthetic or telemetry device (the load) through inductively coupled coils present in the source and load. In some applications, the load may reflect telemetry, status, or other data signals back to the source by impedance modulating the load impedance as a function of the data to be transmitted. For example, the load may include a real or reactive component the value of which is continuously varied as a function of the data to be transmitted, e.g., ECG telemetry data, in order to reflect a portion of the transmitted signal back to the source with magnitude or phase variations representative of the load data.

Alternatively, the load may include means to switch a real or reactive component into or out of circuit with the load in order to reflect binary encoded data pulses to the source. For example, in one application which involves a portable data storage and communication system, a portable, hand-held source of RF power and digital data signals communicates via inductively coupled coils with a miniature load in the form of a data storage device affixed to a patient's wristband, a test tube, a credit card, or other portable object. The data storage device receives and stores the digital data signals transmitted by the source and communicates stored digital data to the source by rapidly switching a resistor in and out of circuit as a function of the state of the stored data signals to reflect digital data pulses to the source. The source detects the reflected data pulses and recovers the transmitted data. This application is fully described and claimed in co-pending U.S. patent application Ser. No. 818,469 filed Jan. 13, 1986 which is assigned to the assignee of this application.

In applications such as those described above where data is transmitted via modulation of the load impedance, it is critically important to discriminate between and separate intentional load impedance modulation used to transmit data from load impedance variations due to other causes. For example, it has been found in the case of implanted telemetry devices that shifting of the device in the body over time alters the relative positions of the inductive coils. It has also been found that hand-held RF source generally cannot be held steady enough to prevent substantial variations in the relative positions of the source and load coils. In both cases, relative displacement of the coils causes the inductive coupling coefficient between the coils and hence the load impedance presented to the source to change or vary. The applicant has discovered that impedance variations due to such coil displacement, for example, are generally relatively low frequency, long term basal variations in comparison to the rapid, high frequency variations due to intentional impedance modulation.

Previous attempts to overcome communications difficulties caused by the displacement of the inductively coupled coils have included adjusting the coupling coefficient by stagger tuning the coils and adjusting the output power level using closed loop feedback control. See, for example, *A Wide-Band Inductive Transdermal Power and Data Link With Coupling Insensitive Gain*, Galbraith et al., IEEE Transactions on Biomedical Engineering, Vol. BME-34, No. 4, Apr. 1987; and *Control External Powering of Miniaturized Chronically Implanted Biotelemetry Devices*, Kadefors, IEEE Transactions on Biomedical Engineering, Vol. BME-23, No. 2, Mar. 1976. The former solution, however, is impracticable with monolithic integrated circuit loads, because of the difficulty and expense of fabricating reactive components in the integrated circuit having the precise values necessary to effect the proper tuning. The latter solution employs a separate feedback transmission signal to adjust the forward power level as a function of the level of the signal received in the load rather than detecting variations in the reflected signal in the primary communications channel.

Thus, there is a need which is not satisfied by known circuits and instruments for an apparatus, hereinafter referred to as a reflectometer, that detects and is responsive to the RF signal reflected by a load and that is insensitive to frequency and magnitude variations in the transmitted or forward RF signal. There is a need for such a reflectometer that is operative over a range of load impedances and that has self-balancing means operative to automatically achieve and maintain a balanced or null output condition for any value of load impedance in that range. Such an apparatus will hereinafter be referred to as a self-balancing reflectometer. There is a need for such a reflectometer that provides simplified means to generate both accurate sign and magnitude information for variations in load impedance as indicated by variations in the reflected RF signal. There is also a need for such a reflectometer that automatically self-balances in response to certain long term basal load impedance variations due to factors such as coil displacement which are unrelated to data transmission and that is capable of simultaneously detecting intentional high frequency load impedance modulation used to transmit load data and providing a detectable output indicative thereof. There is in addition a need for such a reflectometer that is selectably responsive to either the real or imaginary component of load impedance.

A self-balancing reflectometer having the foregoing features and advantages will find use not only in conventional RF communications applications but also in electrical load testing and measurement applications, as well as other data communications applications which employ load impedance modulation techniques. It is therefore an object of the present invention to provide a self-balancing reflectometer apparatus having the foregoing features and advantages as well as others which will be apparent to those skilled in the art.

SUMMARY OF THE INVENTION

The novel reflectometer apparatus of the invention includes means for generating a first sample signal having value related to the load current by a predetermined, fixed first value of gain and a second sample signal having value related to the load voltage by a variable second value of gain. The reflectometer apparatus also includes means for subtracting the first sample signal from the second to generate a difference signal. The reflectometer apparatus further includes means responsive to the difference signal to generate an intermediate signal that varies with the difference signal in response to variations in the impedance of the load from one value of impedance to another, thereby providing a detectable indication of such variations, and means responsive to variations in the intermediate signal to adjust the variable second value of gain to a value necessary to drive the difference signal to zero, thus automatically balancing the reflectometer apparatus to the another value of load impedance.

BRIEF DESCRIPTION OF THE DRAWINGS

The features which are believed to characterize the present invention are set forth in the appended claims. The invention itself, together with these and other features and attendant advantages thereof will be best understood by reference to the following detailed description of a presently preferred embodiment of the invention, together with the appended drawing thereof, in which:

DETAILED DESCRIPTION OF A PRESENTLY PREFERRED EMBODIMENT

Figure 1:
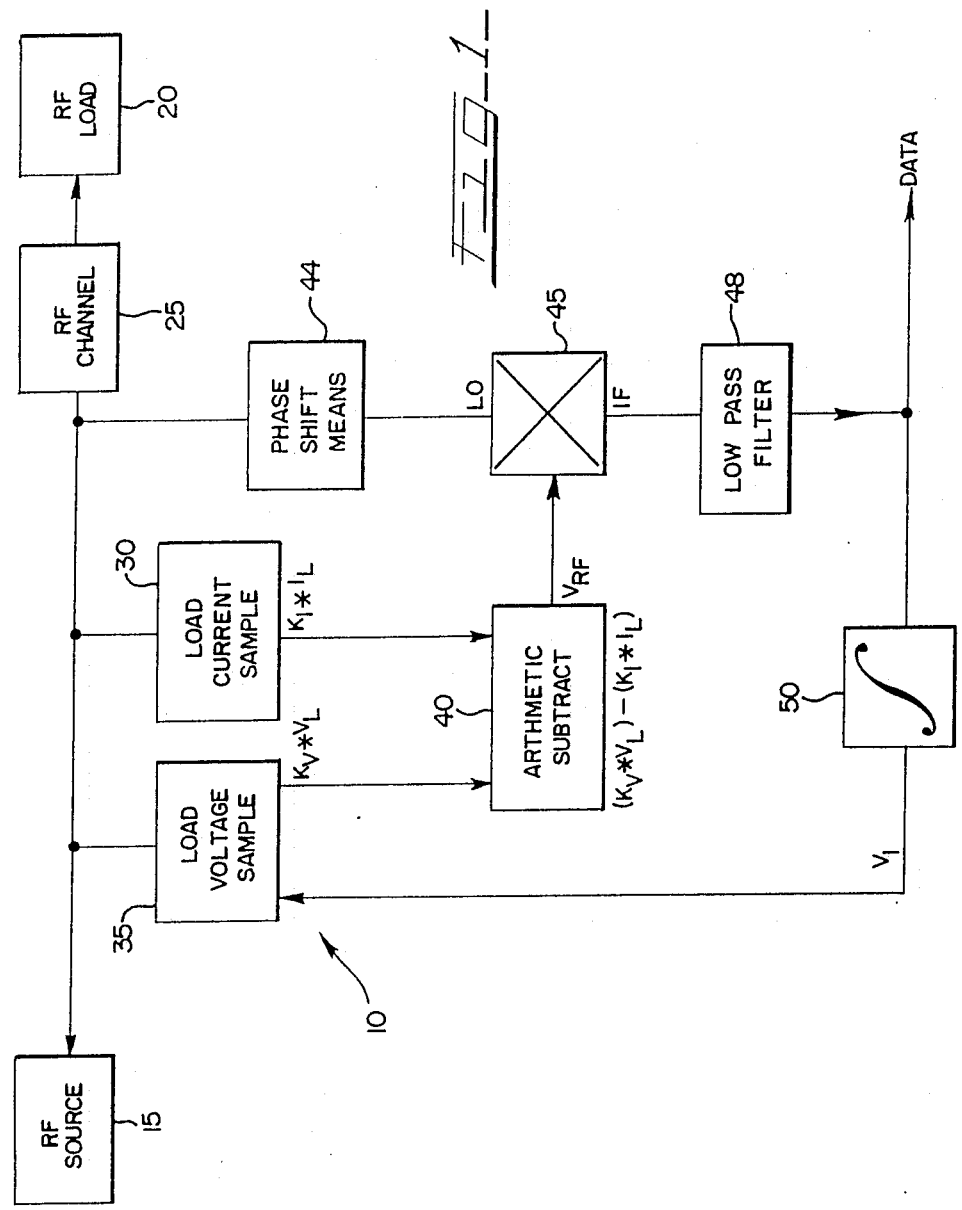
FIG. 1 is a block diagram illustrating generally the functional elements of the preferred embodiment and their interconnections.

FIG. 1 is a block diagram illustrating the major functional elements of a self-balancing reflectometer 10 which comprises a presently preferred embodiment of the invention in conjunction with a system including an RF source 15, RF load 20, and RF channel 25 which links the RF source and load and carries RF signals transmitted by the source 15 and reflected by the load 20. Neither the RF source 15, load 20, nor channel 25 are novel features of the present invention but are disclosed herein merely to facilitate disclosure of the best manner presently known of making and using the preferred embodiment of the self-balancing reflectometer 10.

Self-balancing reflectometers embodying the principles of the invention are not inherently limited to operation with any particular RF source or load, transmission channel, or any particular form of RF signals. Thus, it is contemplated that the RF source 15 may comprise virtually any source of modulated or unmodulated RF signals without having any substantial effect on the operation of the novel self-balancing reflectometer. For example, the preferred self-balancing reflectometer 10 embodiment described in detail below is intended for use with a conventional low-power RF source including sinusoidal and square wave signal generators and a Class D power amplifier output stage that nominally generates a 27.125 MHz, 150 mA, 1.8 V peak to peak sinusoidal carrier, amplitude modulated by a zero DC offset 2 KBPS serial binary data signal.

It is further contemplated that the RF load 20 may comprise virtually any load, including but not limited to discrete or integrated electronic circuits, loads having simple or complex impedance, and high or low impedance loads, without having any substantial effect on the operation of the novel self-balancing reflectometer. For example, in the following description of the preferred self-balancing reflectometer 10 embodiment, RF load 20 is assumed to be a miniature integrated data storage and retrieval circuit similar to that described in the previously identified co-pending application Ser. No. 818,469. The exemplary RF load 20 exhibits an impedance range of approximately 1.5-5K ohms depending upon the distance between the source and load. The load 20 also includes facilities responsive to data originating in the load 20 to switch an additional resistive component of approximately 4.5K ohms into and out of circuit at a rate preferably between 300 BPS and 56 KBPS in order to modulate the real component of the load impedance and reflect a portion of the transmitted RF signal, corresponding to that data, on the RF transmission channel 25.

It is still further contemplated that the RF transmission channel 25 may comprise virtually any type of RF transmission channel, including but not limited to a hard-wired connection, or inductively coupled coils separated by free space. For example, in the description of the preferred self-balancing reflectometer 10 embodiment that follows, it is assumed that the RF transmission channel 25 comprises inductively coupled planar spiral source and load coils separated by approximately 25-125 mils of free space.

The presently preferred self-balancing reflectometer 10 itself generally includes load current sample generating means 30 and load voltage sample generating means 35 both in communication with the RF transmission channel 25, arithmetic subtraction means 40 which is connected to the load current and voltage sample generating means 30 and 35 and which receives load current and load voltage sample signals therefrom, RF signal mixing means 45 having a radio frequency (RF) signal input port connected to the output of the subtraction means 40 and a local oscillator (LO) signal input port in communication with the RF transmission channel 25, via optional quadrature phase shift means 44 low pass filter means 48 having an input connected to an intermediate frequency (IF) output port of the RF signal mixing means 45, and integrator means 50 which has an input connected to the output of the low pass filter means 48 and an output connected to the load voltage sample generating means 35.

The load current sample generating means 30 is responsive to the RF current drawn by the RF load 20 to generate a load current sample signal that comprises a voltage having value related to the value of load current by the expression $K_I * I_L$ where $I_L$ is the value of load current and $K_I$ is a predetermined, fixed gain (or attenuation) value. The load voltage sample generating means 35 is also responsive to the voltage appearing across the RF load 20 to generate a load voltage sample signal which comprises a voltage having value related to the value of the load voltage by the expression $K_V * V_L$ where $V_L$ is the value of the load voltage and $K_V$ is a variable gain (or attenuation) value which varies as a function of the value of the gain adjustment voltage $V_I$ generated by the integrator means 50 described below.

The arithmetic subtraction means 40 continuously performs an arithmetic subtraction of the instantaneous value of the load current sample signal from the load voltage sample signal and generates a difference signal having value given by the expression $(K_V * V_L) - (K_I * I_L)$.

The RF signal mixing means 45 receives the difference signal on its RF signal input port and samples of the RF voltage across the RF load 20 as a local oscillator signal on its LO signal input port via optional quadrature phase shift means 44. The RF signal mixing means 45 continuously performs a vector multiplication of the input signals on the RF and LO ports and generates a sign-inverted intermediate frequency (IF) signal at its IF signal output port. The IF signal contains both a sum of the RF and LO frequencies and a difference of the RF and LO frequencies component. Since the frequency of the RF signals transmitted by the RF source and appearing at the RF load 20 are the same, approximately 27.125 MHz, the IF signal includes a component having double the frequency of the RF and LO input signals and a zero frequency or DC component. The low pass filter means 48 receives the IF signal as an input and generates an intermediate signal which is the DC component of the IF signal with the high frequency sum of the frequencies component filtered out.

The intermediate signal varies in both magnitude and sign with the difference signal in response to impedance variations in the RF load 20. When the load impedance is real and the load voltage and current sample signals are equal, the difference, IF, and intermediate signals are zero. In this condition, the reflectometer 10 is said to be balanced. If a drop in load impedance causes the load current sample signal to exceed the load voltage sample signal, the intermediate signal will go positive with magnitude indicative of the degree of variation in the load impedance. Conversely, if the load impedance increases and causes the load voltage sample signal to exceed the load current sample signal, the intermediate signal will go negative, again with magnitude indicative of the degree of variation in the load impedance.

In addition, as described below, the intermediate signal varies both slowly with low frequency or long-term basal variations in load impedance due, for example to axial, radial, or angular displacement of the source and load coils, and rapidly with high frequency variations in load impedance, for example due to modulation of the load impedance to transmit load data. In the case of high frequency variations, for example due to intentional impedance modulation by the load 20 in accordance with the exemplary modulation parameters disclosed above, the variations which correspond to the data signals originating in the load appear in the intermediate signal. The sign and magnitude of the intermediate signal thus provide detectable indications of both the magnitude and direction of long term and rapid variations in load impedance.

The integrator means 50 receives the intermediate signal as an input and generates a gain adjustment voltage $V_I$ as an output. The integrator means 50 may be a low-pass filter having essentially infinite gain at D.C. with a gain slope of −6 dB/octave.

The integrator means 50 preferably has a time constant long enough to discriminate against high frequency variations in the intermediate signal such as those caused by intentional impedance modulation by the load 20 so that the gain adjustment voltage $V_I$ is responsive only to long term basal variations in load impedance. Thus, the length of the time constant selected for the integrator means 50 basically determines which variations in load impedance will be considered long term basal variations and which will be considered high frequency variations. Variations that have no substantial effect on the value of the gain adjustment voltage $V_I$ will be considered high frequency variations. Variations that have a substantial effect on the value of the gain adjustment voltage $V_I$ will be considered long term basal variations. Thus, as a general rule, it is preferable to select a time constant for the integrator means 50 that is sufficiently long to discriminate against load impedance variations due to the slowest rate of data transmission via impedance modulation expected from the RF load 20.

The gain adjustment voltage $V_I$ is applied as an input signal to the load voltage sample generating means 35. The load voltage sample generating means 35 is responsive to the gain adjustment voltage $V_I$ to adjust the variable gain value $K_V$ as a predetermined function of the magnitude of $V_I$. Thus, as $V_I$ varies with long term variations in the intermediate signal due to long term basal variations in load impedance, the variable gain value $K_V$ varies accordingly. As $K_V$ varies, the difference signal at the RF port of the RF mixing means 45 varies, thus causing the values of the IF and intermediate signals, and the gain adjustment voltage $V_I$ to vary, thus causing further variation in $K_V$, and so on.

These variations in the difference, IF, intermediate, $V_I$, and $K_V$ values, initially caused by long term basal variation in the load impedance from one value to another, continue until the reflectometer automatically reaches a new balance point for the post-variation impedance value of the load. In other words, the reflectometer automatically self-balances to a new balance point each time the load impedance varies from one value of impedance to another, while ignoring rapid impedance variations due to intentional impedance modulation. The balance or null point of the reflectometer 10 is the point at which the values of $V_I$ and hence $K_V$ result in a difference signal at the RF port of the RF signal mixing means 45 equal to zero. This in turn results in the IF and intermediate signals also attaining zero DC states. Once the balance or null point conditions of $V_I$ and $K_V$ are reached, the integrator means 50 maintains the balance point value of $V_I$ and $K_V$ for as long as the new value of load impedance remains static, thus maintaining the reflectometer in its balanced state indefinitely.

As an example, assume that the reflectometer is initially balanced. A relatively slow downward variation in load impedance due to reduction in coil displacement or other factors causes the value of the load current to rise and load voltage to fall. In turn, the value of the load current sample signal increases and the value of the load voltage sample signal decreases. This in turn causes the difference signal, which was zero, to become positive. As a result, the IF and intermediate signals, which also were previously zero, become positive. The positive DC signal on the input of the integrator means 50 causes the value of the output voltage $V_I$ to increase. In the preferred embodiment, the relationship between $V_I$ and $K_V$ is preferably a positive one and thus a non-inverting integrator means 50 is employed. Accordingly, $V_I$ continues to increase as long as the positive DC signal remains on the input of the integrator means 50. Eventually, $V_I$ reaches a value at which the variable gain value $K_V$ is such that the load voltage sample signal equals the load current sample signal. At this point, the difference signal goes to zero and the reflectometer is again balanced. So long as the long term basal variation in load impedance continues, the reflectometer will continue to automatically self-balance. When the impedance of the load becomes static, the reflectometer will retain its balanced state at that value of impedance for as long as it remains static.

When the reflectometer is balanced, high frequency, zero DC offset impedance modulation by the load 20 to transmit data is indicated in the intermediate signal as high frequency amplitude modulation pulses in an otherwise zero magnitude DC signal. These pulses can be amplified and level shifted, if necessary, using conventional means and then processed as data pulses. If the data modulation is not DC-balanced, the pulses will appear with a DC offset which can result in an erroneous shift in apparent basal impedance as indicated by a change in the gain adjustment voltage V.I. Of course, as described above, the high frequency DC-balanced impedance modulation pulses do not have any effect on the integrator means 50 or the gain adjustment voltage $V_I$ and hence have no effect on the balanced state of the reflectometer 10.

Also when the reflectometer is balanced, the variable and fixed gain values $K_V$ and $K_I$ provide a detectable indication of the actual value of the impedance of the load 20. At the balance point, the difference signal is zero and the following expression holds true:

$$\frac{K_I}{K_V} = \frac{V_L}{I_L} = R_L$$

It can thus be seen that the impedance of the load $R_L$ is equal to the ratio of the variable and fixed gain values $K_V$ and $K_I$ of the load voltage and current sample generating means 35 and 30 when the reflectometer 10 is balanced.

The ratio of the gain values $K_I$ and $K_V$ is substantially independent of both frequency and amplitude variations in the RF signals transmitted by the RF source 15. As a result, the preferred self-balancing reflectometer provides improved immunity to impedance measurement errors induced by RF source variations over prior art reflectometers, particularly those employing directional coupler apparatus. In addition, the insensitivity of the preferred reflectometer 10 to variations in RF signals transmitted by the RF source, makes it advantageously adapted for use during simultaneous data transmission by the RF source so that simultaneous bidirectional data transmission between the RF source and load is possible.

Thus far, the description of the preferred self-balancing reflectometer 10 has not distinguished between an RF load 20 exhibiting simple impedance having a real and no imaginary component and a load having complex impedance with both real and imaginary components. The preferred self-balancing reflectometer 10 is equally operative with RF loads exhibiting simple and complex impedances and can be adapted to respond, via optional quadrature phase shift means 44, to either component. Thus, when the RF signal is applied directly to the LO input port of the RF signal mixing means 45 is in phase with the RF load voltage, the DC component of the IF signal which comprises the intermediate signal is responsive to variations in the real but not the imaginary component of the load impedance. Since the imaginary component of the difference signal is in phase quadrature with the LO signal, when the mixing means 45 trigonometrically multiplies the LO and RF signals, the imaginary component of the difference signal always results in a difference of the frequencies component equal to zero and thus does not contribute to the DC component of the IF signal. Similarly, when the RF signal is phase shifted via quadrature phase shift means 44; and before it is input to the LO port so that the LO signal is in phase quadrature with the RF load voltage, the DC component of the IF signal is responsive to variations in the imaginary component of the load impedance and not to the real component of the load impedance.

Figure 2:
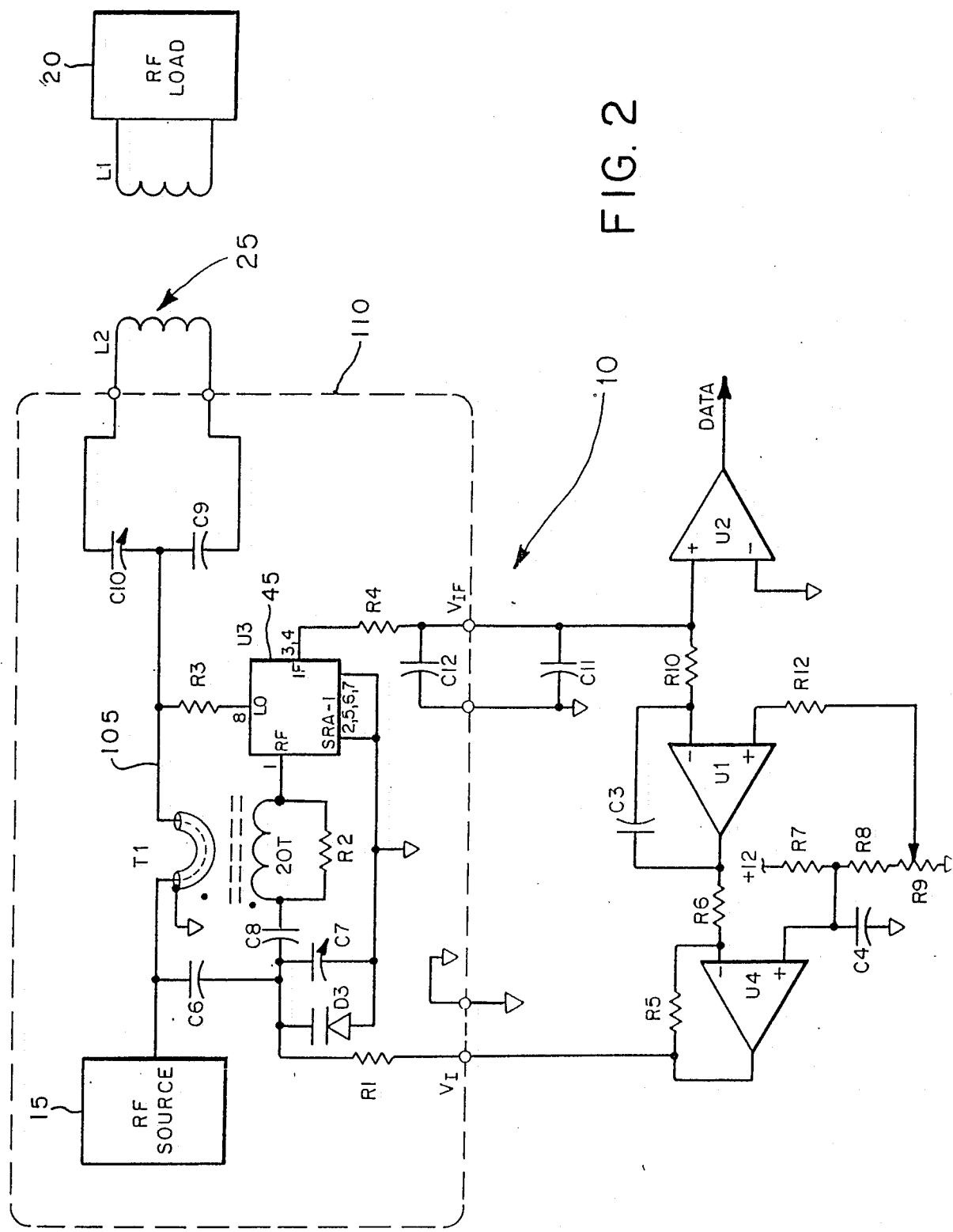
FIG. 2 is an electrical schematic diagram illustrating in detail the electrical elements and interconnections of the preferred embodiment.

FIG. 2 illustrates a detailed electrical schematic diagram of the presently preferred embodiment of the self-balancing reflectometer 10 in conjunction with the RF source 15, load 20, and transmission channel 25 described above. The transmission channel 25 includes a conventional coaxial transmission line 105 that connects the RF source 15 to the junction of series-connected capacitors C9 and C10. Capacitors C9 and C10, which are connected across the source output coil L2, function as an impedance matching network with C10 preferably being adjustable in order to match the nominal impedance of the load 20. The source coil L2 and the load coil L1 preferably comprise planar, spiral-type coils, each having approximately 10 turns of approximately 36–38 AWG magnet wire and an outer diameter of approximately 0.25 inches. Preferably, the RF sensitive elements of the reflectometer 10, i.e., the RF source 15, transmission line 105, load current sample generating means 30, load voltage sample generating means 35, arithmetic subtraction means 40, and RF signal mixing means 45 are surrounded by a grounded shield 110 which may be fabricated from 6 mil copper flashing or other suitable RF shield material to prevent the introduction of extraneous RF noise into the reflectometer circuitry.

The load current sample generating means 30 comprises a transformer T1 having a toroidal ferrite core and a primary to secondary turns ratio of 1:$N_S$, where $N_S$ is the number of secondary turns and is preferably 20. The RF transmission line 105 is inserted through the core and a coax shield isolates the primary from the secondary to prevent the coupling of noise or other voltage signals to the secondary by way of transformer stray capacitance, so that the transformer T1 functions as a current-to-current transformer. The transformer generates a current in the secondary that is equal to $1/N_S$ of the load current flowing in the primary. A resistor R2 is connected across the secondary to convert the load current sample to a corresponding voltage. The voltage across R2 comprises the current sample signal and is related to the load current by a predetermined fixed gain value of $K_I = R2/N_S$. The value of R2 is preferably selected to be quite high in relation to the reactance of the transformer secondary so that it will dominate the inductance and cause the secondary voltage to be substantially in phase with the load current with no substantial variation due to frequency variations in the primary. The transformer T1 thus effectively isolates the load current sample signal from frequency variations in the RF signals transmitted by the RF source 15. This allows the reflectometer to be operated during simultaneous transmission of modulated RF signals by the RF source 15 over a wide modulation frequency bandwidth and makes simultaneous bidirectional communication between the RF source 15 and load 20 possible. For reasons that will become apparent below, the primary and secondary of the transformer T1 are preferably configured so that when the load impedance is purely resistive, the current sample induced across resistor R2 in the secondary is 180 degrees out of phase with the voltage sample appearing across capacitor C7.

The load voltage sample generating means 35 comprises a capacitive voltage divider which includes capacitor C6 and varactor diode D3 connected in series between the transmission line 105 and ground. The varactor diode D3 exhibits a junction capacitance $C_J$ which varies approximately inversely with the gain control voltage $V_I$. A capacitor C7, which is preferably a variable capacitor, is connected in parallel with D3 and acts as a trimmer to compensate D3 for device dependent deviations from the nominal capacitance value for the selected varactor. Because the primary of the transformer T1 has a very low impedance, the voltage appearing at the junction of the voltage divider and the transmission line 105 is substantially equivalent to the source voltage. The voltage divider generates a load voltage sample voltage at the junction of C6 and D3 that is in phase with the reflected RF signal and that is related to the load voltage by a gain value equal to the division ratio of the voltage divider which is, disregarding the minimal effect of trimmer C7, given by the expression $K_V = (C6)/(C6 + C_J)$. The gain value $K_V$ is variable because the capacitance value of D3 varies with the reverse bias voltage across it according to a predetermined function which is set forth in the data sheets provided with the selected varactor device by the manufacturer. Although the exact functional relationship between capacitance and voltage may differ somewhat from part to part and manufacturer to manufacturer, as a general rule the capacitance $C_J$ of D3 varies approximately inversely with the magnitude of the reverse bias voltage across it. Thus, as the voltage across D3 increases, the capacitance $C_J$ of D3 decreases, the gain value $K_V$ of the divider increases, and as a result the magnitude of the load voltage sample increases. Conversely, when the magnitude of the voltage across D3 decreases, the capacitance of D3 increases, the gain value $K_V$ decreases and the magnitude of the load voltage sample decreases.

The variable gain value $K_V$ and hence the value of the load voltage sample signal are directly related to the division ratio of the voltage divider. Since the division ratio is essentially insensitive to frequency variations in the RF signals transmitted by the RF source 15, the presently preferred reflectometer 10 has the significant advantage of providing accurate operation during simultaneous transmission of carrier modulated data by the RF source 15 over a wide modulation frequency bandwidth. As a result, simultaneous bidirectional data transmission between the RF source 15 and load 20 is possible.

Although a varactor diode is preferred as the voltage responsive device for controlling the load variable gain value $K_V$, it should be apparent that other voltage responsive devices could also be used. Such devices could include, for example, a field effect transistor (FET) or a PIN diode.

Having now defined the fixed and variable gain values $K_I$ and $K_V$ in terms of the circuit elements of the preferred reflectometer, the value of the selected component of load impedance may be expressed as follows when the reflectometer 10 is balanced:

$$R_L = \frac{K_I}{K_V} = \frac{R2(C6 + C_J)}{(N_S)(C6)}$$

The junction of C6 and D3 of the voltage divider is connected to one end of the secondary coil and resistor R2 of the transformer T1 through a DC blocking capacitor C8. The configuration of the primary and secondary of transformer T1 is shown in FIG. 2 by use of the dot convention, which is well-known to those skilled in the art. As described above, the primary and secondary of the transformer T1 are configured so that when the load impedance is purely resistive, the current sample induced across resistor R2 in the secondary is 180 degrees out of phase with the voltage sample appearing across capacitor C7. Thus, the voltage representative of the load current sample is effectively inverted with respect to the voltage representative of the load voltage sample. Since the connection between the voltage divider and the transformer secondary is essentially a summing junction, the resulting voltage at the RF input port of the RF signal mixing means 45 is the difference of the variable gain load voltage and fixed gain load current sample signals. It should be apparent to those skilled in the art that other means could also be used to form the difference signal. For example, if the transformer T1 were configured so that when the load impedance is purely resistive, the load current sample and the load voltage sample are in phase, the voltage across the secondary could be applied to a unity gain inverting amplifier and the output of the amplifier summed with the voltage divider output voltage. As a further example, in-phase voltage and current samples could be supplied to the non-inverting input and inverting input, respectively, of a differential amplifier.

The RF signal mixing means 45 is preferably a synchronous demodulator U3, also referred to as a double balanced mixer. The LO input port of the synchronous demodulator U3 is connected through a resistor R3 to the transmission line 105. The RF signal across the load 20 is provided to the synchronous demodulator as the local oscillator signal.

Since R3 does not phase shift the reflected RF signal, the signal at the LO input port is in phase with the real component of the difference signal at the RF input port and the synchronous demodulator U3 is operative to respond to variations in the real component of the RF load 20 while rejecting variations in the imaginary component. Alternatively, R3 could be replaced with optional quadrature phase shift means in a manner which is known in the art. The quadrature phase shift means could generally comprise a reactive component such as a capacitor or inductor to phase shift the LO signal by 90 degrees and render the synchronous demodulator U3 responsive to variations in the imaginary component of the load impedance and non-responsive to variations in the real component of the load impedance. The IF signal, which includes both the sum and difference components of the LO and RF frequencies as described above appears at the IF port of the synchronous demodulator U3.

The low pass filter means 48 comprises a conventional low pass RC filter comprised of resistor R4 connected in series with parallel capacitors C11 and C12 between the IF output port of the synchronous demodulator U3 and ground. The values of the resistor R4 and capacitors C11 and C12 are selected to filter substantially all of the sum of the frequencies component (approximately 54.25 MHz) from the IF signal. The voltage signal $V_{IF}$ appearing across the capacitor C11 comprises the DC component of the IF signal, identified previously as the intermediate signal, with the sum of the frequencies component removed.

As previously described, the intermediate signal $V_{IF}$ varies with both long term basal and rapid, modulation induced variations in the load impedance. In particular, in the reflectometer 10 illustrated in FIG. 2, $V_{IF}$ varies only in response to variations in the real component of the load impedance. When the reflectometer is balanced, rapid impedance modulation by the load 20 appears in $V_{IF}$ as high frequency amplitude modulation data pulses on a zero volt DC waveform. A high gain amplifier such as a voltage comparator U2 can be used to amplify these pulses, which in the embodiment described herein are in the range of about 6 mV peak to peak, before applying them to other circuits such as a level shifter, decoder, memory, microprocessor, or the like.

$V_{IF}$ is also applied to the inverting input of the integrator means 50 which comprises an operational amplifier U1, capacitor C3 and resistor R10 configured as an integrator, and an operational amplifier U4 and resistors R5 and R6 configured as a unity gain inverting amplifier. The voltage at the output of U4 is the gain adjustment voltage $V_I$. The time constant of the integrator is predominantly a function of the values of C3 and R10. In the preferred embodiment, the values of these components have been selected to provide a time constant of approximately 100 microseconds so that impedance modulation by the load 20 at a rate of approximately 100 KHz has no substantial effect on the integrator output. In applications where a stream of data is to be transmitted by the load 20 over a period in excess of the integrator time constant, it is preferable to use a data coding scheme having a net DC average value of zero such as a Manchester or similar code in order to prevent applying a net DC value to the integrator.

Although not illustrated, it is understood that a conventional DC power supply provides a +12 V DC supply voltage to each of the illustrated reflectometer components which require a DC source voltage for operation, including U1 thru U4. In addition, the amplifiers U1 and U4 are biased from the +12V DC source through a resistive voltage divider comprised of resistors R7 and R8 and potentiometer R9 to compensate the output of the integrator for the DC offset of the amplifier U1 and to preset the gain adjustment voltage $V_I$ output by the unity gain amplifier U4 to a mid-scale value of +6 VDC when the integrator output is at a mid-scale value of 6 VDC. The non-inverting input of U1 is biased with the value of the U1 DC offset voltage so that when $V_{IF}$ is zero, there is no change in the integrator output due to the DC offset of U1. The U1 output swing is approximately 1-11 VDC. Resistors R7 and R8 are selected to provide 6 VDC plus the value of the DC offset compensating voltage of R9 to the non-inverting input of U4 so that when U1 output is at its mid-scale output of 6 VDC, the gain adjustment voltage $V_I$ will be at its mid-scale output value of +6 VDC. The gain adjustment voltage $V_I$ output by U4 has an output swing between approximately +1 VDC and +11 VDC. The gain adjustment voltage $V_I$ at the output of U4 is connected to the junction of the load voltage sample generating voltage divider by a resistor R1 thus completing the loop between the synchronous demodulator U3 and the load voltage and current sample generating means 30 and 35.

The following table identifies preferred values, parameters, and sources for the electronic components shown in the circuit of FIG. 2.

| Designation | Description | Source |
|---|---|---|
| R1 | 100K ohm metal film | |
| R2, R3 | 390 ohm ¼W 5 carbon film | |
| R4 | 100 ohm ¼W 5 carbon film | |
| R5, R6, R7 | 10K ohm ¼W 5 carbon film | |
| R8, R10, R12 | 10K ohm metal film | |
| R9 | 50 ohm cermet trim pot, 1 turn | |
| C3 | 10 nF 50 V 10 polyester metal film | |
| C4 | 0.1 uF | |
| C6 | 5 pF silver mica 5 | |
| C7, C10 | 5-40 pF ceramic trimmer | E. F. Johnson #274-0035-005 |
| C8 | 0.01 uF | |
| C9 | 150 pF silver mica 5%, 100 V | |
| C11, C12 | 0.001 uF | |
| D3 | Varactor diode. | Motorola MV2109 |
| U1, U4 | IC quad op amp, low VOS | National LM324AN |
| U2 | IC comparator, low VOS | National LM339AN |
| U3 | IC mixer, 7 dBm LO, .5-500 MHz, DC IF | Mini-Circuits SRA-1 |
| T2 | Current sense transformer | |
| | ferrite core, toroid | Ferroxcube 1041T060-4C4 |
| intega | Magnet wire, #32AWG, 20T, Secondary | Belden 8056 |
| | Coax cable, 54 ohm, .085 in. OD, 1 in. L | Microdot 250-3804 |

What have been described are certain features and aspects of a self-balancing reflectometer which constitutes a presently preferred embodiment of the invention. It is understood that the foregoing description and accompanying illustrations are merely exemplary and are in no way intended to limit the scope of the invention, which is defined solely by the appended claims and their equivalents. Various changes and modifications to the preferred embodiment will be apparent to those skilled in the art, including for example the use of a variable gain load current sample and fixed gain load voltage sample to generate a difference signal, the use of different types of transmission lines, or different adjustment signal responsive means to vary the gain value of the variable gain load voltage or current sample generating means. Such changes and modifications can be made without departing from the spirit and scope of the invention. Accordingly, it is intended that all such changes and modifications and all other equivalents be covered by the appended claims.

I claim:

1. Self-balancing reflectometer apparatus for detecting impedance variations in an RF load in a system including an RF source, RF load, and RF transmission channel linking said source and load for carrying RF signals, characterized by a load voltage and a load current, transmitted by said source and to said load, comprising:

means in communication with said transmission channel for generating a first sample signal having value related to the load current by a predetermined fixed first value of gain;

means in communication with said transmission channel for generating a variable second sample signal having value related to the load voltage by a variable second value of gain;

means for subtracting said first sample signal and said second sample signal to generate a difference signal;

means responsive to said difference signal for generating an intermediate signal having value that varies with said difference signal, thereby providing a detectable indication of such variations; and means responsive to variations of said intermediate signal for automatically adjusting said variable second value of gain to a value necessary to drive said difference signal to zero, thereby automatically balancing said reflectometer to said another value of load impedance.

2. The apparatus defined in claim 1 wherein said means for generating a first sample signal includes means for electrically isolating said first sample signal from in the RF voltage transmitted by said RF source so that said voltage has substantially no effect on said first sample signal.

3. The apparatus defined in claim 1 wherein said means for generating a first sample signal includes transformer means having a primary winding in communication with said transmission channel and a secondary winding for electrically isolating said first sample signal from the RF voltage transmitted by said RF source so that said voltage has substantially no effect on said first sample signal.

4. The apparatus defined in claim 1 wherein said means for generating said second sample signal comprises voltage divider means having an electronically variable division ratio comprising said variable second value of gain.

5. The apparatus defined in claim 1 wherein said means for generating said second sample signal comprises voltage divider means including series-connected first capacitor means having a fixed value of capacitance and second capacitor means having an electronically adjustable value of capacitance to provide a variable division ratio comprising said variable second value of gain.

6. The apparatus defined in claim 1 wherein said means for subtracting said first and second sample signals comprises means for generating first and second sample signals load current when said load impedance is purely resistive that are 180 degrees out of phase.

7. The apparatus defined in claim 1 wherein said means for subtracting said first and second sample signals comprises means for generating a first sample signal that is 180 degrees out of phase with the load current.

8. The apparatus defined in claim 1 wherein said means for generating said second sample signal comprises means for generating a second sample signal that is in phase with the load voltage.

9. The apparatus defined in claim 1 wherein said means for generating an intermediate signal comprises means responsive only to the component of said difference signal that is in phase with said load voltage signal for generating an intermediate signal that varies only with variations in the real component of the load impedance.

10. The apparatus defined in claim 1 wherein said means for generating an intermediate signal comprises means responsive only to the component of said difference signal that is in phase quadrature with said load voltage signal for generating an intermediate signal that varies only with variations in the imaginary component of the load impedance.

11. The apparatus defined in claim 1 wherein said means for generating an intermediate signal includes RF signal mixing means having said load voltage signal as a local oscillator input and said difference signal as an RF signal input.

12. The apparatus defined in claim 1 wherein said means for generating an intermediate signal includes means for generating an intermediate signal that varies with a first sign in response to variations in load impedance in a first direction and with a second sign in response to load impedance variations in a second direction, thereby providing a detectable indication of the direction of variation of said load impedance.

13. The apparatus defined in claim 1 wherein said means for generating an intermediate signal comprise:
RF signal mixing means having said load voltage signal as a local oscillator input and said difference signal as an RF signal input for generating said intermediate signal; and
load impedance component selection means for phase shifting said load voltage signal applied to said RF signal mixing means as a local oscillator signal to correspond to a selected component of the load impedance in which variations are to be detected.

14. The apparatus defined in claim 1 wherein said means for automatically adjusting said variable second value of gain includes means responsive to long term basal variations in said intermediate signal indicative of long term basal variations in the load impedance for automatically adjusting the value of said second value of gain to oppose said variations in said intermediate signal and balance said reflectometer.

15. The apparatus defined in claim 1 wherein said means for automatically adjusting said second value of gain includes integrator means responsive only to long term basal variations in said intermediate signal having frequency lower than a minimum rate of impedance modulation expected from the RF load for generating a gain adjustment signal having magnitude and sign adapted to oppose said variations; and wherein said means for generating a second sample signal includes means responsive to said gain adjustment signal for varying said second value of gain in a predetermined relationship with the magnitude of said gain adjustment signal to oppose said variations and balance said reflectometer.

16. The apparatus defined in claim 1 including means responsive to rapid variations in said intermediate signal indicating rapid modulation of the load impedance for generating output data signals corresponding to said impedance modulation.

17. Self-balancing reflectometer apparatus for automatically measuring the impedance of an RF load in a system including an RF source, RF load, and RF transmission channel linking said source and load for carrying RF signals characterized by a load voltage and a load current, transmitted by said source to said load, comprising:
means in communication with said transmission channel for generating a first sample signal having value related to the load current by a predetermined fixed first value of gain;
means in communication with said transmission channel for generating a variable second sample signal having value related to the load voltage by a variable second value of gain;
means for subtracting said first sample signal and said second sample signal to generate a difference signal;
means responsive to said difference signal for generating an intermediate signal having value that varies with said difference signal, and that remains constant when said load impedance is static;
means responsive to variations of said intermediate signal for generating a gain adjustment signal having magnitude and sign adapted to oppose said variations of said intermediate signal; and
said means for generating a second sample signal including means responsive to said gain adjustment signal for automatically varying said second value of gain to a value necessary to drive said difference signal to zero, thereby automatically balancing said reflectometer to said another value of load impedance, the value of said gain adjustment signal necessary to balance said reflectometer having a predetermined relationship to the value of the load impedance and thus providing a detectable indication thereof.

18. The apparatus defined in claim 17 wherein said means for generating a first sample signal includes means for electrically isolating said first sample signal the RF voltage transmitted by said RF source so that said voltage has substantially no effect on said first sample signal.

19. The apparatus defined in claim 17 wherein said means for generating a first sample signal includes transformer means having a primary winding in communication with said transmission channel and a secondary for electrically isolating said first sample signal from the RF signal transmitted by said RF source so that said voltage has substantially no effect on said first sample signal.

20. The apparatus defined in claim 17 wherein said means for generating said second sample signal comprises voltage divider means having an electronically variable division ratio responsive to said gain adjustment signal and comprising said variable second value of gain.

21. The apparatus defined in claim 17 wherein said means for generating said second sample signal comprises voltage divider means including series-connected first capacitor means having a fixed value of capacitance and second capacitor means having a value of capacitance that varies in a predetermined relationship in response to said gain adjustment signal thus providing a variable division ratio comprising said variable second value of gain.

22. The apparatus defined in claim 17 wherein said means for subtracting said first and second sample signals comprises means for deriving first and second sample signals that are 180 degrees out of phase, when said load impedance is purely resistive.

23. The apparatus defined in claim 17 wherein said means for subtracting said first and second sample signals comprises means for generating a first sample signal that is 180 degrees out of phase with the load current.

24. The apparatus defined in claim 17 wherein said means for generating said second sample signal comprises means for generating a second sample signal that is in phase with the load voltage.

25. The apparatus defined in claim 17 wherein said means for generating an intermediate signal comprises means responsive only to the component of said difference signal that is in phase with the real component of said load signal for generating an intermediate signal that varies only with variations in the real component of the load impedance so that when said reflectometer is balanced, the value of said gain adjustment signal is indicative of the value of the real component of said impedance.

26. The apparatus defined in claim 17 wherein said means for generating an intermediate signal comprises means responsive only to the component of said difference signal that is in phase quadrature with said load signal for generating an intermediate signal that varies only with variations in the imaginary component of the load impedance so that when said reflectometer is balanced, the value of said gain adjustment signal is indicative of the value of the imaginary component of said load impedance.

27. The apparatus defined in claim 17 wherein said means for generating an intermediate signal includes RF signal mixing means having said load signal as a local oscillator input and said difference signal as an RF signal input.

28. The apparatus defined in claim 17 wherein said means for generating an intermediate signal includes means for generating an intermediate signal that varies with a first sign in response to variations in load impedance in a first direction and with a second sign in response to load impedance variations in a second direction, thereby providing a detectable indication of the direction of variation of said load impedance.

29. The apparatus defined in claim 17 wherein said means for generating an intermediate signal comprise:
   RF signal mixing means having said load signal as a local oscillator input and said difference signal an RF signal input for generating said intermediate signal; and
   load impedance component selection means for phase shifting said load signal applied to said RF signal mixing means as a local oscillator signal to correspond to a selected component of the load impedance which is to be measured.

30. The apparatus defined in claim 17 wherein said means responsive to variations of said intermediate signal includes means responsive to long term basal variations of said intermediate signal indicative of long term basal variations in the load impedance for generating a gain adjustment signal that is adapted to balance said reflectometer for long term basal variations in load impedance.

31. The apparatus defined in claim 17 wherein said means responsive to variations of said intermediate signal for generating said gain adjustment signal includes integrator means responsive only to long term basal variations of said intermediate signal having frequency lower than a minimum impedance modulation rate expected from the RF load for generating a said gain adjustment signal adapted to balance said reflectometer for long term basal variations in said load impedance.

32. The apparatus defined in claim 17 including means responsive to rapid variations of said intermediate signal indicating rapid modulation of the load impedance means for generating output data signals corresponding to said impedance modulation.

33. Self-balancing reflectometer apparatus for detecting variations in the impedance of an RF load corresponding to load data signals in a system including an RF source, RF load, and RF transmission channel linking said source and load for carrying RF signals, characterized by a load voltage and a source voltage, transmitted by said source to said load, comprising:
   means in communication with said transmission channel for generating a first sample signal having value related to the load current by a predetermined fixed first value of gain;
   means in communication with said transmission channel for generating a second sample signal having value related to the load voltage by a variable second value of gain;
   means for subtracting said first sample signal and said second sample signal to generate a difference signal;
   means responsive to said difference signal for generating an intermediate signal having value that varies with said difference signal in response to both long-term and rapid variations in the load impedance;
   means responsive to long-term variations of said intermediate signal corresponding to long-term variations in said load impedance for automatically adjusting said variable second value of gain to a value necessary to drive said difference signal to zero, thereby automatically balancing said reflectometer to said load impedance; and means responsive to rapid variations of said intermediate signal corresponding to rapid modulation of said load impedance corresponding to load data for generating output data signals corresponding to said impedance modulated load data.

34. The apparatus defined in claim 33 wherein said means for generating said first sample signal includes means for electrically isolating said first sample signal the RF voltage transmitted by said RF source so that said voltage has substantially no effect on said first sample signal.

35. The apparatus defined in claim 33 wherein said means for generating said first sample signal includes transformer means having a primary winding in communication with said transmission channel and a secondary winding for electrically isolating said first sample signal from the RF voltage transmitted by said RF source so that said voltage has substantially no effect on said first sample signal.

36. The apparatus defined in claim 33 wherein said means for generating said second sample signal comprises voltage divider means having an electronically variable division ratio comprising said variable second value of gain.

37. The apparatus defined in claim 33 wherein said means for generating said second sample signal comprises voltage divider means including series-connected first capacitor means having a fixed value of capacitance and second capacitor means having an electronically adjustable value of capacitance to provide a variable division ratio comprising said variable second value of gain.

38. The apparatus defined in claim 33 wherein said means for subtracting said first and second sample signals comprises means for generating first and second sample signals 180 degrees out of phase when said load impedance is purely resistive.

39. The apparatus defined in claim 33 wherein said means for subtracting said first and second sample signals comprises means for generating a first sample signal that is 180 degrees out of phase with the load current.

40. The apparatus defined in claim 33 wherein said means for generating said second sample signal comprises means for generating a second sample signal that is in phase with the load voltage.

41. The apparatus defined in claim 33 wherein said means for generating an intermediate signal comprises means responsive only to the component of said difference signal that is in phase with the said load voltage for generating an intermediate signal that varies only with variations in the real component of the load impedance so that said means for generating output data signals is responsive only to modulation of the real components of load impedance.

42. The apparatus defined in claim 33 wherein said means for generating an intermediate signal comprises means responsive only to the component of said difference signal that is in phase quadrature with said load voltage for generating an intermediate signal that varies only with variations in the imaginary component of the load impedance so that said means for generating output data signals is responsive only to modulation of the imaginary component of load impedance.

43. The apparatus defined in claim 33 wherein said means for generating an intermediate signal includes RF signal mixing means having said load voltage signal as a local oscillator input and said difference signal as an RF signal input.

44. The apparatus defined in claim 33 wherein said means for generating an intermediate signal includes means for generating an intermediate signal that varies with a first sign in response to variations in load impedance in a first direction and with a second sign in response to load impedance variations in a second direction, thereby providing a detectable indication of the direction of variation of said load impedance.

45. The apparatus defined in claim 33 wherein said means for generating an intermediate signal comprise:
RF signal mixing means having said load voltage signal as a local oscillator input and said difference signal as an RF signal input for generating said intermediate signal; and
load impedance component selection means for shifting said load voltage signal applied to said RF signal mixing means as a local oscillator signal to correspond to a selected component of the load impedance in which modulation is to be detected.

46. The apparatus defined in claim 33 wherein said means for automatically adjusting said variable second value of gain includes integrator means responsive only to long term variations in said intermediate signal having frequency lower than a minimum impedance modulation rate expected from the RF load for generating a gain adjustment signal having magnitude and sign adapted to oppose said long term variations; and wherein said means for generating said second sample signal includes means responsive to said gain adjustment signal for varying said second value of gain as a predetermined function of the magnitude of said gain adjustment signal to balance said reflectometer.

* * * * *